United States Patent [19]
Kunikane et al.

[11] Patent Number: 5,291,571
[45] Date of Patent: Mar. 1, 1994

[54] DUPLICATED LIGHT SOURCE MODULE

[75] Inventors: Tatsuro Kunikane, Kawasaki; Saburo Uno, Osaka; Nobuhiro Fukushima, Kawasaki, all of Japan

[73] Assignee: Fujitsu Limited, Kawasaki, Japan

[21] Appl. No.: 32,313

[22] Filed: Mar. 17, 1993

[30] Foreign Application Priority Data

Mar. 19, 1992 [JP] Japan .................................. 4-063967
Mar. 31, 1992 [JP] Japan .................................. 4-077112

[51] Int. Cl.⁵ ........................... G02B 6/26; G02B 5/30
[52] U.S. Cl. .................................... 385/93; 385/11;
385/31; 385/33; 385/35; 385/36; 385/89;
385/92; 359/494; 359/496; 359/500
[58] Field of Search ............ 385/11, 16, 24, 31,
385/33, 35, 36, 47, 49, 88, 89, 92, 93;
250/227.11; 359/483, 494, 495, 496, 500

[56] References Cited

U.S. PATENT DOCUMENTS

| | | | |
|---|---|---|---|
| 4,548,478 | 10/1985 | Shirasaki | 356/351 |
| 4,720,162 | 1/1988 | Mochizuki et al. | 385/36 X |
| 4,805,977 | 2/1989 | Tamura | 385/11 |
| 4,893,890 | 1/1990 | Lutes | 385/33 X |
| 4,904,043 | 2/1990 | Schweizer | 385/35 X |
| 4,978,189 | 12/1990 | Blonder et al. | 385/35 X |
| 5,074,682 | 12/1991 | Uno et al. | 385/93 |
| 5,125,053 | 6/1992 | Abe et al. | 385/36 |
| 5,172,369 | 12/1992 | Chikuma et al. | 385/33 X |
| 5,212,710 | 5/1993 | Kaneda et al. | 385/11 X |
| 5,223,975 | 6/1993 | Naganuma et al. | 385/11 X |

*Primary Examiner*—Brian Healy
*Attorney, Agent, or Firm*—Staas & Halsey

[57] ABSTRACT

Disclosed herein is a duplicated light source module constructed so that rays of light emitted from two light sources pass through one lens and then enter one optical fiber through a birefringent element. This module is useful when a light source in an optical transmitter is intended to be duplicated or when a high-power pumping source in an optical fiber amplifier is required.

16 Claims, 8 Drawing Sheets

DUPLICATED LIGHT SOURCE MODULE

BACKGROUND OF THE INVENTION

1. Field of the Invention

The present invention relates to a duplicated light source module.

It is sometimes required to duplicate a light source in a transmitter, so as to construct a highly reliable optical communication system. In such a case, rays of light from both light sources are preliminarily adapted to be coupled to an optical transmission line. In the initial stage of operation of a system, one of the light sources is used. In the event that this light source is troubled or will be possibly troubled during the operation, the other light source is selected instead. Thus, system failure is prevented.

Further, there is another case that it is required to enlarge an output of a light source device by multiplexing a light source. For example, in a fiber type optical amplifier recently in practical application, such enlargement of the output of the light source device is effective in requiring high-energy pumping light.

2. Description of the Related Art

Conventionally, a laser diode (LD) module is known as an example of a light source device for use in an optical communication system or the like. The LD module is constituted of a laser diode (LD) chip, an end portion of an optical fiber, and a lens for optically coupling the LD chip to the end portion of the optical fiber. These members are arranged in predetermined positional relationship to each other. Duplication of such an LD module is effected by utilizing the fact that light to be emitted from the LD chip is substantially linearly polarized light. That is, two LD modules each having a polarization plane maintaining fiber as an optical fiber for outputting light are used, and rays of light output from the polarization plane maintaining fibers of the two LD modules are made enter a single optical fiber through a polarization beam splitter. Accordingly, in duplicating a light source device in the prior art, the light source device becomes large in size because of the necessity of use of the polarization plane maintaining fibers, for example.

Further, the use of a birefringent element functioning as an optical isolator is known as an optical device for optically coupling a pair of optical fibers (U.S. Pat. No. 4,548,478).

SUMMARY OF THE INVENTION

It is therefore an object of the present invention to provide a light source module which can duplicate a light source and can be reduced in size.

It is another object of the present invention to aim at easy manufacturing of such a light source module.

According to an aspect of the present invention, there is provided a light source module having a first light source, a second light source and an optical fiber optically coupled with said first and second light sources, said light source module comprising a first assembly comprising said first and second light sources arranged so that a plane of polarization of light emitted from said first light source is perpendicular to a plane of polarization of light emitted from said second light source; a first lens having a principal axis positioned between a first principal axis of said light emitted from said first light source and a second principal axis of said light emitted from said second light source; a birefringent element for receiving said rays of light emitted from said first and second light sources and passed through said first lens and for outputting light on a single optical path; a second assembly comprising said optical fiber arranged so that said ray of light output from said birefringent element enters an end of said optical fiber; and holding means for holding said first lens and said birefringent element to said first assembly and said second assembly so as to maintain predetermined positional relation.

In the present invention, the rays of light emitted from the first and second light sources pass through the first lens and then enter the optical fiber through the birefringent element. Therefore, a compact light source module can be provided.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

There will now be described some preferred embodiments of the present invention with reference to the drawings.

Figure 1:
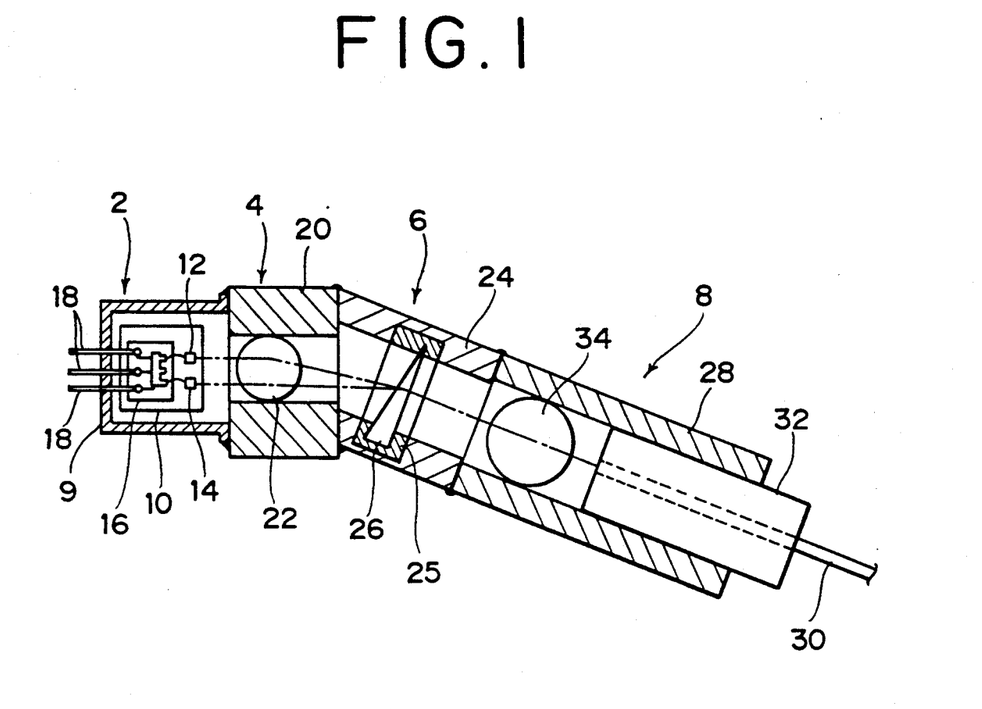
FIG. 1 is a vertical sectional view of a light source module according to a first preferred embodiment of the present invention.

FIG. 1 is a vertical sectional view of a light source module according to a first preferred embodiment of the present invention. The light source module is constituted of a laser diode (LD) assembly 2, a lens assembly 4, a prism assembly 6 and a fiber assembly 8, which are arranged in this order and fixed to each other. In the LD assembly 2, reference numeral 10 denotes a heat sink fixed in a case 9. Laser diode (LD) chips 12 and 14 are mounted on the heat sink 10. A principal axis (principal optical path) of light emitted from the LD chip 12 is nearly parallel to a principal axis (principal optical path) of light emitted from the LD chip 14. Planes of polarization of rays of light from the LD chips 12 and 14 are perpendicular to each other. An IC chip 16 functioning as a driver circuit or the like is fixed on the heat sink 10. The LD chips 12 and 14 are electrically connected to the IC chip 16 by wire bonding. The IC chip 16 is electrically connected through terminals 18 to an external circuit (not shown). The lens assembly 4 is constituted of a pipe 20 and a ball lens 22 press-fitted in the pipe 20. A principal axis (geometrical center axis) of the ball lens 22 is set between the parallel principal axes of the LD chips 12 and 14 so as to be nearly parallel to them. In the prism assembly 6, reference numeral 24 denotes a pipe having an inclined end surface. A prism (wedge plate) 26 is fixed through a holder 25 in the pipe 24. The prism 26 is formed from a uniaxial crystal showing birefringence, such as rutile. The fiber assembly 8 is constituted of a pipe 28, a ferrule 32 fixedly inserted in the pipe 28, an optical fiber 30 fixedly inserted in a center hole of the ferrule 32, and a ball lens 34 press-fitted in the pipe 28 so as to be opposed to an end surface of the optical fiber 30. These assemblies 2, 4, 6 and 8 are adjusted in relative position, and thereafter fixed to each other by laser welding or the like.

Figure 2:
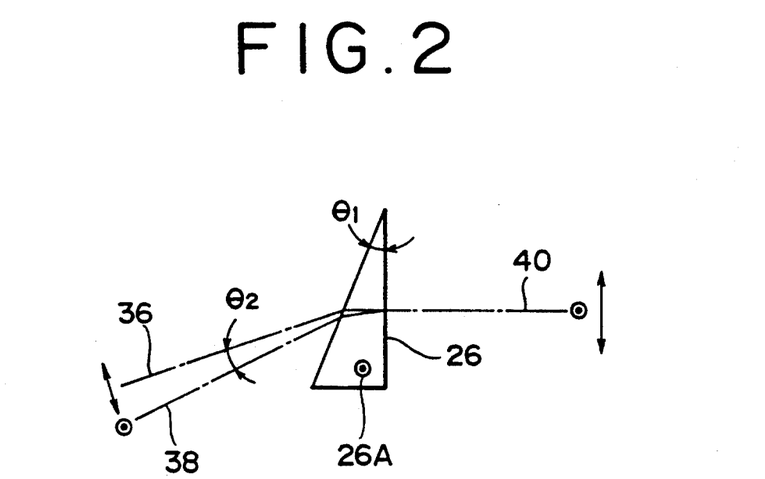
FIG. 2 is a schematic side view illustrating a function of a birefringent prism (wedge plate) shown in FIG. 1.

FIG. 2 illustrates a function of the prism 26 formed from a birefringent crystal. In FIG. 2, reference numeral 26A denotes an optic axis (C-axis) of the birefringent crystal forming the prism 26. The optic axis 26A is assumed to be perpendicular to a plane of the sheet of FIG. 2. Reference numerals 36 and 38 denote first and second incident axes to the prism 26, respectively, and reference numeral 40 denotes an output axis from the prism 26. The first and second incident axes 36 and 38 and the output axis 40 are in positional relationship to each other such that an ordinary ray (polarized light having a plane of polarization parallel to the plane of the sheet of FIG. 2) entered the prism 26 along the first incident axis 36 and an extraordinary ray (polarized light having a plane of polarization perpendicular to the plane of the sheet of FIG. 2) entered the prism 26 along the second incident axis 38 are output from the prism 26 along the output axis 40. In the case where the material of the prism 26 is rutile, and a vertex angle $\theta_1$ of the prism 26 is 20°, an angle $\theta_2$ between the first incident axis 36 and the second incident axis 38 becomes about 11°. Thus, by using a prism (wedge plate) formed from a birefringent crystal, rays of light entered the prism along two incident axes can be output from the prism along one output axis.

Figure 3:
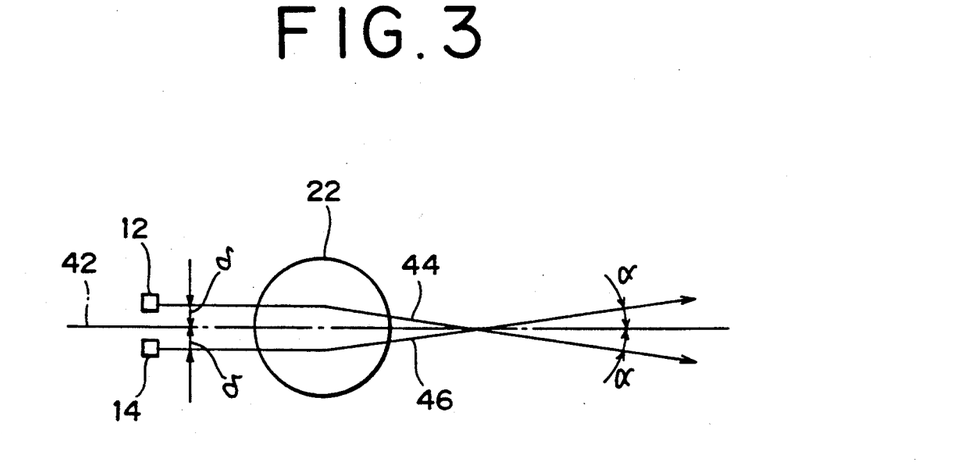
FIG. 3 is a schematic side view illustrating the arrangement of two LD chips and a lens shown in FIG. 1.

FIG. 3 illustrates a function of the ball lens 22 shown in FIG. 1. In FIG. 3, reference numeral 42 denotes a principal axis of the ball lens 22. The principal axis 42 is positioned to be parallel to both the principal axes of the LD chips 12 and 14. In the following description, a distance between each principal axis of the LD chips 12 and 14 and the principal axis 42 of the ball lens 22 will be represented as δ. Light emitted from the LD chip 12 is converged by the ball lens 22 and deflected at a given angle α, then being output from the ball lens 22 along an output axis 44. On the other hand, light emitted from the LD chip 14 is also converged by the ball lens 22 and deflected at the angle α in a direction reverse to a deflecting direction of the output light from the LD chip 12, then being output from the ball lens 22 along an output axis 46. The deflection angle α of each output light from the LD chips 12 and 14 by the deflecting function of the ball lens 22 is given by the following expression.

$$\alpha = \tan^{-1}(\delta/f)$$

where, f represents a focal length of the ball lens 22.

Accordingly, the rays of light from the LD chips 12 and 14 can be output from the prism 26 on the same optical path by locating the LD chips 12 and 14, the ball lens 22 and the prism 26 so that the output axes 44 and 46 from the ball lens 22 shown in FIG. 3 may coincide with the first and second incident axes 36 and 38 to the prism 26, respectively, and by setting the LD chips 12 and 14 so that a plane of polarization of the output light from the LD chip 12 may become parallel to a plane of the sheet of FIG. 3 and that a plane of polarization of the output light from the LD chip 14 may become perpendicular to the plane of the sheet of FIG. 3.

Referring back to FIG. 1, the light output from the prism 26 can be converged by the ball lens 34 and made enter the optical fiber 30. In this case, a confocal optical system can be formed to improve an optical coupling efficiency of the LD chips 12 and 14 to the optical fiber 30 by making a distance between each of the LD chips 12 and 14 and the ball lens 22 (more exactly, a distance between each exciting end of the LD chips 12 and 14 and a center of the ball lens 22) nearly equal to a focal length of the ball lens 22, and by making a distance between the ball lens 34 and the optical fiber 30 (more exactly, a distance between a center of the ball lens 34 and an excited end of the optical fiber 30) nearly equal to a focal length of the ball lens 34.

Figure 4A:
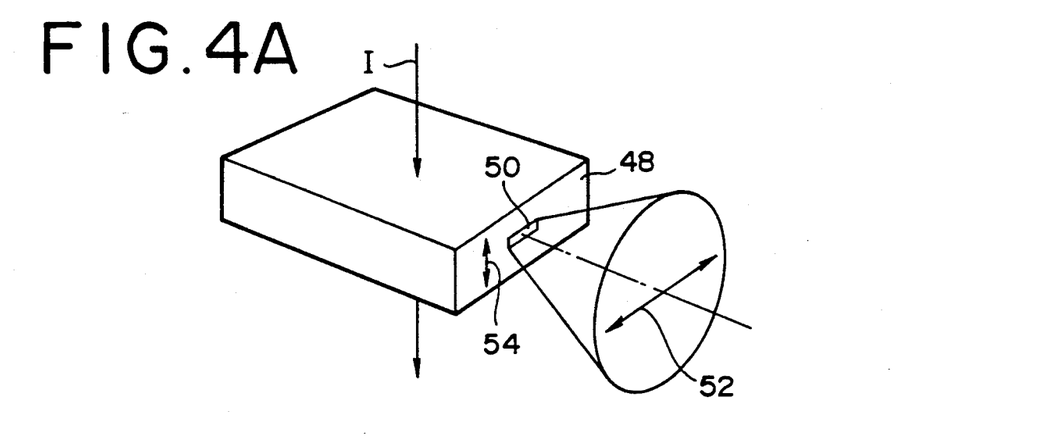
FIG. 4A is a schematic perspective view illustrating a plane of polarization of light to be emitted from one type of LD chip.
Figure 4B:
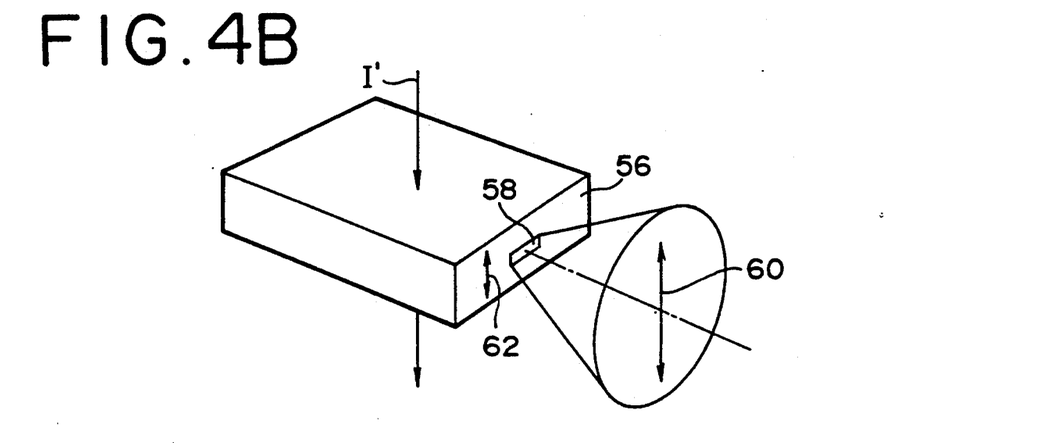
FIG. 4B is a view similar to FIG. 4A, illustrating another type of LD chip.

FIGS. 4A and 4B illustrate different types of examples employable as the LD chips 12 and 14 shown in FIG. 1. In the type shown in FIG. 4A, when an injection current is applied to a chip body 48 as shown by an arrow I, a circular conical or elliptic conical beam of light is emitted from an exciting end of an active layer 50 of the chip body 48. This beam has a principal axis shown by a one-dot chain line in FIG. 4A. A plane of polarization of the beam is perpendicular to a laminating direction (shown by an arrow 54) in the active layer 50 as shown by an arrow 52. A double hetero type LD often used in the field of optical communication belongs to the type shown in FIG. 4A. In contrast thereto, in the type shown in FIG. 4B, when an injection current is applied to a chip body 56 as shown by an arrow I', a conical beam of light is similarly emitted from an exciting end of an active layer 58 of the chip body 56. However, a plane of polarization of the beam shown in FIG. 4B is parallel to a laminating direction 62 in the active layer 58 as shown by an arrow 60. A strain superlattice laser of a tensor type (tensile stress type) belongs to the type shown in FIG. 4B.

Figure 5A:
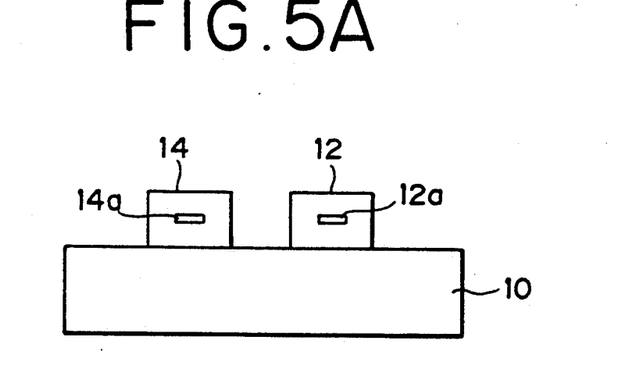
FIG. 5A is a schematic elevational view illustrating an example of the arrangement of the two LD chips shown in FIG. 1.
Figure 5B:
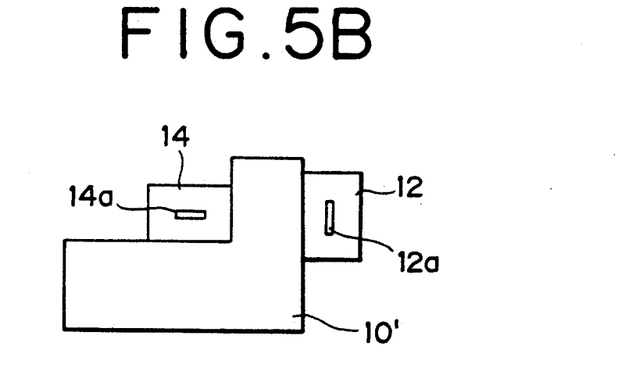
FIG. 5B is a view similar to FIG. 5A, illustrating another example of the arrangement of the two LD chips shown in FIG. 1.

FIGS. 5A and 5B are elevational views illustrating different examples of arrangement of the LD chips 12 and 14. In the example shown in FIG. 5A, the LD chips 12 and 14 are fixed on a flat surface of the heat sink 10 in such a manner that active layers 12a and 14a of the LD chips 12 and 14 become parallel to each other (e.g., the active layers 12a and 14a are disposed on the same plane). In this case, one of the LD chips 12 and 14 corresponds to either the type of FIG. 4A or the type of FIG. 4B, and the other LD chip corresponds to the other type. According to this example, earth electrodes of the LD chips 12 and 14 can be fixed directly to the heat sink 10 by soldering or the like, thereby contributing to easy manufacturing. In contrast thereto, in the example shown in FIG. 5B, the LD chips 12 and 14 are fixed to an L-shaped heat sink 10' in such a manner that the active layers 12a and 14a of the LD chips 12 and 14 become perpendicular to each other. In this case, either the type of FIG. 4A or the type of FIG. 4B can be employed as both the LD chips 12 and 14, thereby contributing to easy procurement and identification.

Figure 6:
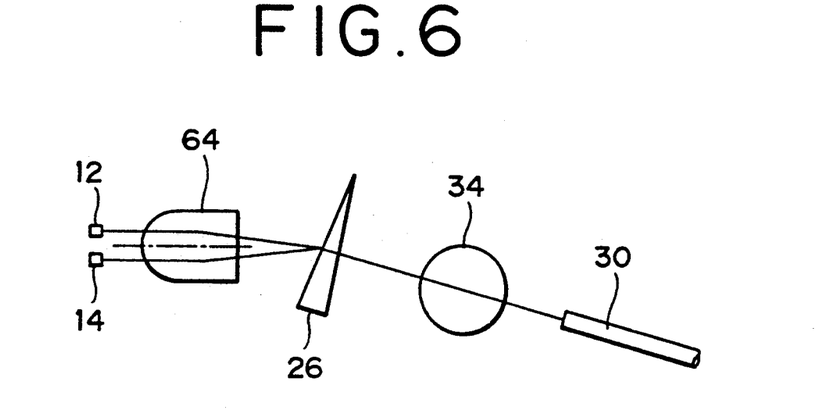
FIG. 6 is a schematic side view of an essential part of a light source module according to a second preferred embodiment of the present invention.

FIG. 6 shows an essential part of a light source module according to a second preferred embodiment of the present invention. The second preferred embodiment differs from the first preferred embodiment shown in FIG. 1 in the point that a graded index rod lens 64 is substituted for the ball lens 22 provided between the LD chips 12 and 14 and the prism 26. More specifically, the rod lens 64 has a semispherical end surface opposed to the LD chips 12 and 14 and a flat end surface opposed to the prism 26. For example, the rod lens 64 is of a 0.16-pitch type having a radius of 2 mm and a maximum refractive index of 1.636. Further, an index distribution parameter $\sqrt{A}$ of the rod lens 64 is 0.4 mm$^{-1}$. According to the second preferred embodiment, an angular aperture of the rod lens 64 on the LD chips 12 and 14 side can be enlarged. Therefore, if the size of the module in the second preferred embodiment is equal to that in the first preferred embodiment, a distance between the LD chips 12 and 14 in the second preferred embodiment can be enlarged as compared with the first preferred embodiment employing the ball lens. For example, the distance (2δ) between the LD chips 12 and 14 in the second preferred embodiment can be set to 40 μm.

Figure 7:
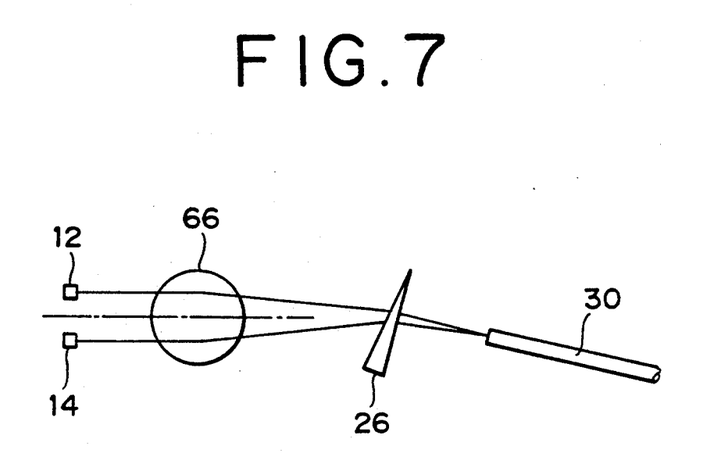
FIG. 7 is a schematic side view of an essential part of a light source module according to a third preferred embodiment of the present invention.

FIG. 7 shows an essential part of a light source module according to a third preferred embodiment of the present invention. In the third preferred embodiment, no lens is provided between the prism 26 and the optical fiber 30, and a ball lens 66 is provided between the LD chips 12 and 14 and the prism 26. The rays of light emitted from the LD chips 12 and 14 are converged by the ball lens 66 only. In this case, a distance between each of the LD chips 12 and 14 and the ball lens 66 (more exactly, a distance between each exciting end of the LD chips 12 and 14 and a center of the ball lens 66) is set to be larger than a focal length of the ball lens 66. According to the third preferred embodiment, although an optical coupling efficiency becomes slightly lower than that in the first preferred embodiment shown in FIG. 1 or the second preferred embodiment shown in FIG. 6, the construction can be simplified.

Figure 8:
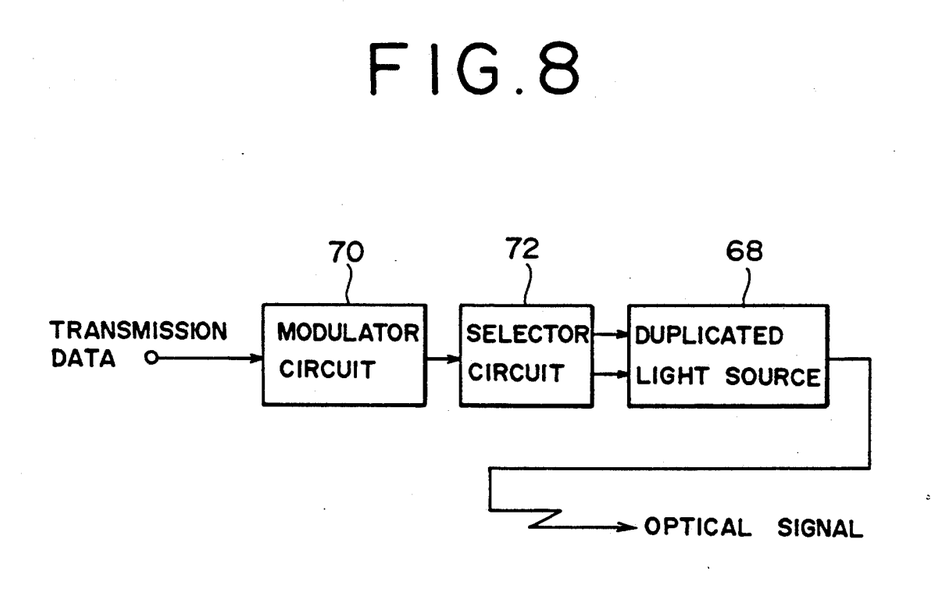
FIG. 8 is a block diagram of an optical transmitter to which the light source module of the present invention is applied.

FIG. 8 is a block diagram of an optical transmitter to which the present invention is applied. A selector circuit 72 is provided between a duplicated light source module 68 according to the present invention and a modulator circuit 70 to which a transmission data is supplied, so that a modulation signal from the modulator circuit 70 is selectively supplied to one of two light sources in the duplicated light source module 68. In the case where the two light sources are LD chips, the modulation signal is superimposed to a bias current to be supplied to the LD chips. According to this construction, one of the two light sources in the light source module 68 is driven in the initial stage of operation. If this light source is deteriorated or troubled, the other light source is selected, thereby ensuring a long-term operation of the optical transmitter regardless of a life of each light source. In modification, two modulator circuits may be provided for the two light sources in the light source module 68, respectively, and these modulator circuits may be selectively driven.

Figure 9:
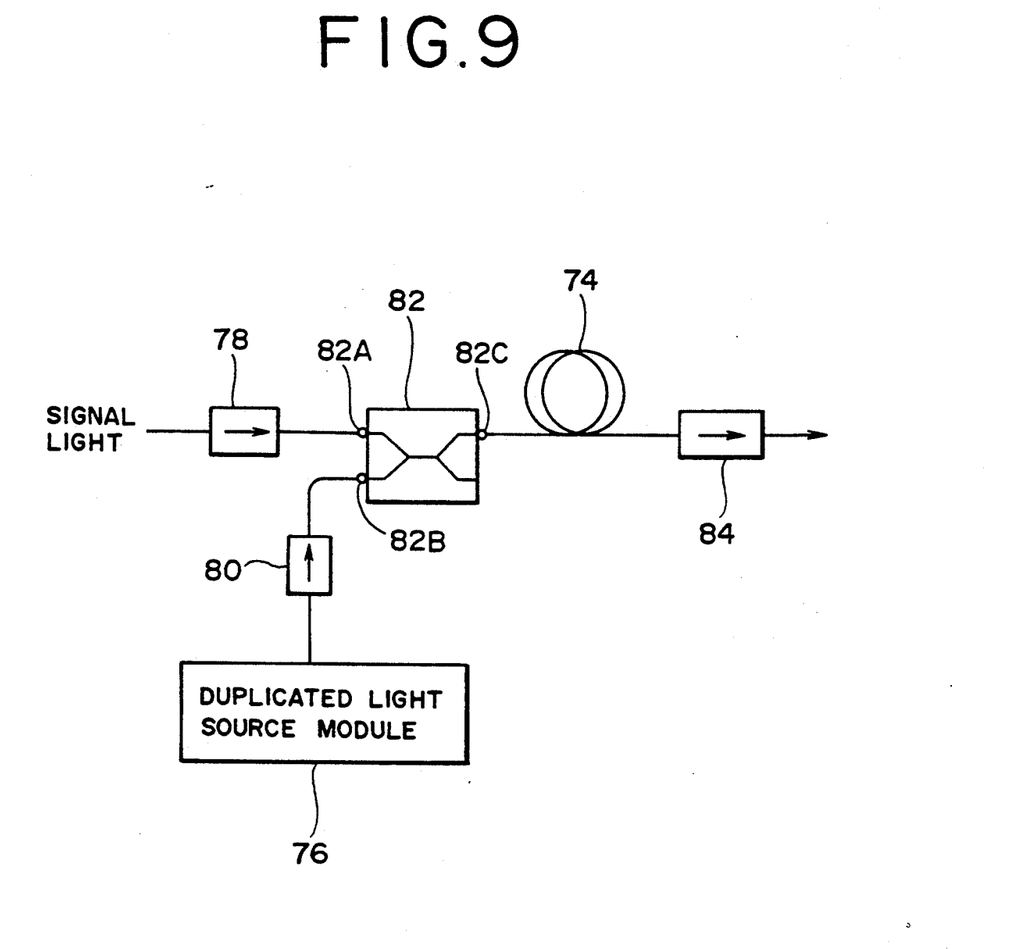
FIG. 9 is a block diagram of an optical amplifier to which the light source module of the present invention is applied.

FIG. 9 is a block diagram of an optical amplifier to which the present invention is applied. The optical amplifier is provided with a doped fiber 74 doped with a rare earth element such as Er. A light source module 76 according to the present invention is used as a pumping source. Signal light to be amplified is supplied through an optical isolator 78 to a port 82A of a optical coupler 82. Pumping light from the light source module 76 is supplied through an optical isolator 80 to a port 82B of the coupler 82. The coupler 82 functions so as to output the signal light and the pumping light from a port 82C by utilizing a difference in wavelength between the signal light and the pumping light, for example. The signal light and the pumping light output from the coupler 82 are supplied to a first end of the doped fiber 74. When the signal light and the pumping light are supplied to the doped fiber 74, stimulated emission by the pumping light and the rare earth element occurs to amplify the signal light. The signal light thus amplified is output from a second end of the doped fiber 74. In order to obtain a required gain and other characteristics in such an amplifying operation, it is required not only to optimize the construction of the doped fiber 74 but also to increase a power and a spectral purity of the pumping light. According to the present invention, the rays of light having the same wavelength from the two light sources can be simultaneously supplied as the pumping light to the doped fiber, thereby meeting the requirement of a high power of the pumping light to improve the performance of the optical amplifier. In the case where the light sources are LD chips, a DC bias of each LD chip is controlled, so as to obtain the pumping light having a constant or controlled intensity.

Figure 10:
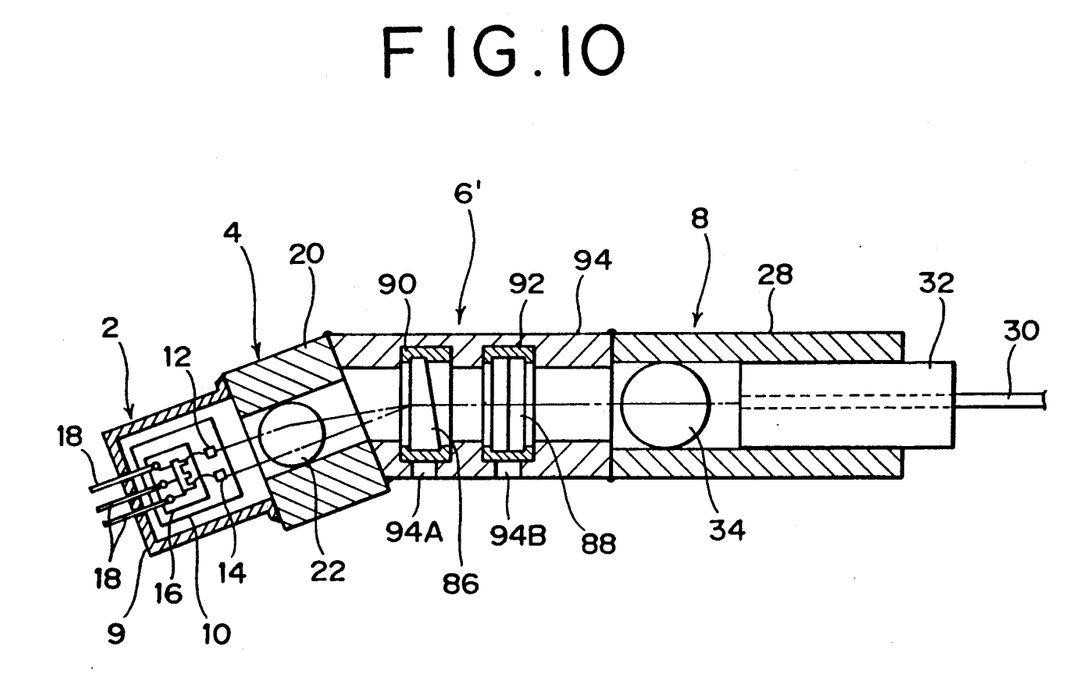
FIG. 10 is a vertical sectional view of a light source module according to a fourth preferred embodiment of the present invention.

FIG. 10 is a vertical sectional view of a light source module according to a fourth preferred embodiment of the present invention. The fourth preferred embodiment differs from the first preferred embodiment shown in FIG. 1 in the point that a prism assembly 6' is substituted for the prism assembly 6 shown in FIG. 1. The other parts are substantially the same as those shown in FIG. 1, and they are denoted by the same reference numerals as those shown in FIG. 1. Referring to FIG. 10, the prism assembly 6' includes two wedge plates 86 and 88 formed from a uniaxial crystal showing birefringence, such as rutile. The wedge plates 86 and 88 are fixed in ring-shaped holders 90 and 92 formed of resin or the like, respectively. The holders 90 and 92 are rotatably supported in a pipe 94. Reference numerals 94A and 94B denote holes formed on an outer side surface of the pipe 94 so as to communicate with the holders 90 and 92, respectively. Accordingly, the holders 90 and 92 can be rotated from the outside of the pipe 94 through the holes 94A and 94B, respectively. The pipe 94 has a first or oblique end fixed to a pipe 20 of a lens assembly 4 and a second or vertical end fixed to a pipe 28 of a fiber assembly 8.

Prior to explanation of a function of the light source module shown in FIG. 10, there will now be described a feature of a light source module having a single wedge plate with reference to FIG. 11. As similar to the preferred embodiment shown in FIG. 1 or 10, LD chips 12 and 14, lenses 22' and 34' and an optical fiber 30 are arranged in this order. Further, a single wedge plate 86' is provided between the lenses 22' and 34'. The wedge plate 86' corresponds to the prism 26 shown in FIG. 1.

Figure 11:
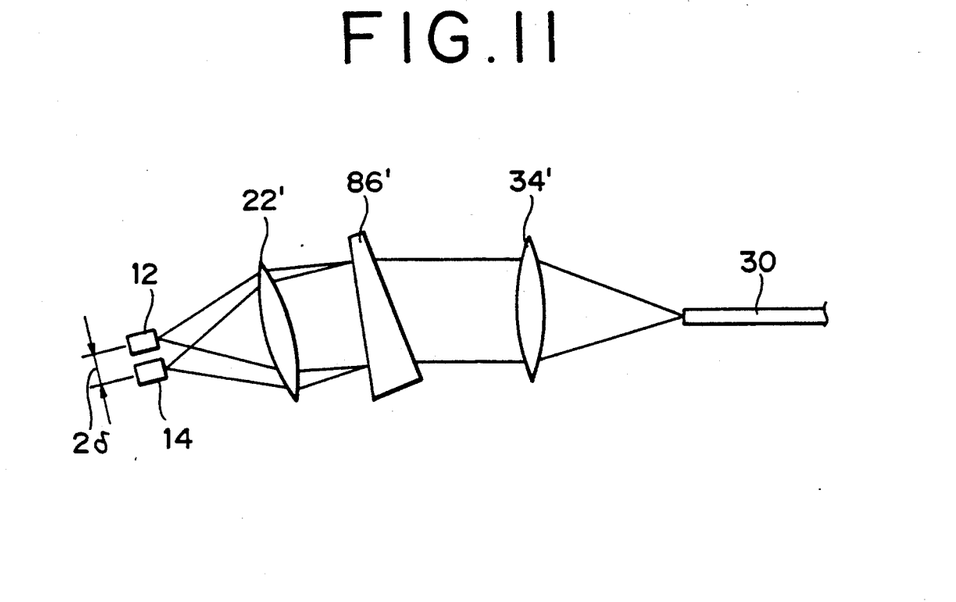
FIG. 11 is a schematic side view illustrating a feature of a light source module having a single wedge plate.

In the case shown in FIG. 11, a deflection angle in the wedge plate 86' is univocally defined by a material and a wedge angle of the wedge plate 86'. Accordingly, an optical coupling efficiency between the LD chips 12 and 14 and the optical fiber 30 is directly dependent upon a relative positional relation between the LD chips 12 and 14 with the distance δ used as a parameter. In other words, unless the relative positional relation between the LD chips 12 and 14 is set with a high accuracy such as within 1 μm, the optical coupling efficiency between the LD chips 12 and 14 and the optical fiber 30 will be reduced. Accordingly, much time is required for position adjustment of the LD chips 12 and 14.

According to the fourth preferred embodiment shown in FIG. 10, when there is a variation in the relative positional relation between the LD chips 12 and 14 in manufacturing the module, at least one of the two wedge plates 86 and 88 is rotationally adjusted to thereby cope with the above variation. This will be described below more specifically.

Figure 12:
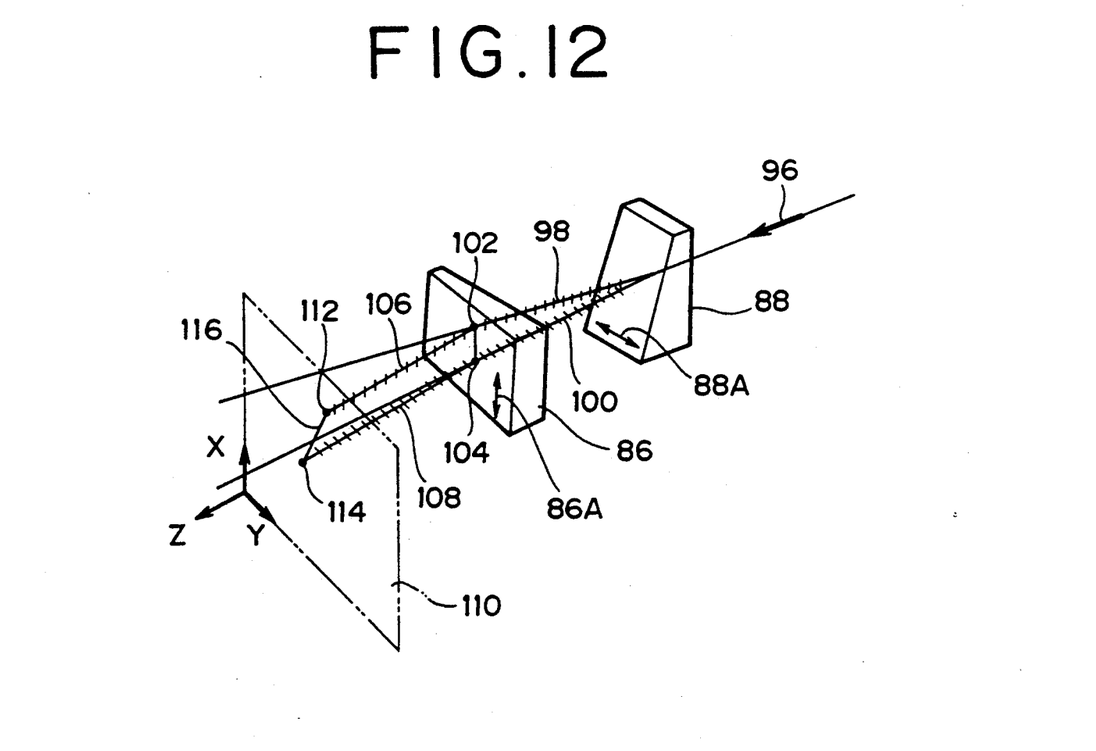
FIG. 12 is a schematic perspective view illustrating a function of two wedge plates shown in FIG. 10.

FIG. 12 illustrates a function of the wedge plates 86 and 88 shown in FIG. 10. In the fourth preferred embodiment, the wedge plates 86 and 88 can be adjusted in relative angle therebetween so that the rays of light emitted from the LD chips 12 and 14 (see FIG. 10) and transmitted through the wedge plate 86 enter the wedge plate 88 along two optical paths, and are then output from the wedge plate 88 along an exactly single optical path. To easily understand this principle, it is assumed that a direction of travel of light is reverse to that in the module. That is, referring to FIG. 12, there is shown an assumptive model such that a ray of light incident on the wedge plate 88 along one optical path in a direction of arrow 96 is angularly divided into two rays of light which are in turn output from the wedge plate 86 along two optical paths. In the following description, there will be used an orthogonal three-dimensional coordinate system X-Y-Z consisting of a Z-axis parallel to the arrow 96, a Y-axis parallel to an optic axis (C-axis) 88A of the wedge plate 88, and an X-axis perpendicular to both the Y-axis and the Z-axis. In the example shown in FIG. 12, the wedge plates 86 and 88 are identical with each other. In the initial condition, the wedge plates 86 and 88 are arranged in relative rotational position such that wedge directions of the wedge plates 86 and 88 define an angle of 90°. That is, an optic axis 86A of the wedge plate 86 is orthogonal to the optic axis 88A of the wedge plate 88 in the initial condition. Accordingly, the optic axis 86A of the wedge plate 86 is parallel to the X-axis.

The ray of light entered the wedge plate 88 along the arrow 96 is divided into an ordinary ray having a direction of polarization parallel to the X-axis and an extraordinary ray having a direction of polarization parallel to the Y-axis, and the ordinary ray and the extraordinary ray are output from the wedge plate 88. Reference numeral 98 denotes a principal axis of an optical path of the ordinary ray refracted with a given refractive index in the wedge plate 88, and reference numeral 100 denotes a principal axis of an optical path of the extraordinary ray refracted with a refractive index larger than the refractive index for the ordinary ray in the wedge plate 88. Reference numeral 102 denotes a point of intersection between the principal axis 98 and a principal plane of the wedge plate 86, and reference numeral 104 denotes a point of intersection between the principal axis 100 and the principal plane of the wedge plate 86. A segment connecting the point of intersection 102 and the point of intersection 104 is parallel to the X-axis. As the direction of polarization of the ray of light passing through the point of intersection 102 is parallel to the X-axis, this ray of light becomes an extraordinary ray in the wedge plate 86, and is refracted by the wedge plate 86 at a relatively large refraction angle in a Y-Z plane. On the other hand, as the direction of polarization of the ray of light passing through the point of intersection 104 is parallel to the Y-axis, this ray of light becomes an ordinary ray in the wedge plate 86, and is refracted by the wedge plate 86 at a relatively small refraction angle in the Y-Z plane. Reference numeral 106 denotes a principal axis of the refracted light passing through the point of intersection 102 and output from the wedge plate 86, and reference numeral 108 denotes a principal axis of the refracted light passing through the point of intersection 104 and output from the wedge plate 86. Reference numeral 110 denotes an X-Y plane spaced a given distance from the wedge plate 86. The exciting ends of the LD chips 12 and 14 (see FIG. 10) are assumed to lie on the X-Y plane 110. Reference numeral 112 denotes a point of intersection between the principal axis 106 and the X-Y plane 110, and reference numeral 114 denotes a point of intersection between the principal axis 108 and the X-Y plane 110.

When the relative rotational angle between the wedge plates 86 and 88 is changed by rotating the wedge plate 86 about an axis parallel to the Z-axis, for example, a length of a segment 116 connecting the point of intersection 112 and the point of intersection 114 and an angle between the segment 116 and the Y-axis are changed according to an angle of rotation of the wedge plate 86. Accordingly, the length and a direction of the segment 116 can be adjusted by rotating at least one of the wedge plates 86 and 88. In other words, the rays of light emitted from the two exciting ends lying on the X-Y plane in an allowable distance range can be output from the wedge plate 88 along a single optical path irrespective of a relative positional relation between the two exciting ends by rotationally adjusting at least one of the wedge plates 86 and 88. For example, when a design value of the distance between the two exciting ends of the LD chips 12 and 14 (see FIG. 10) is 300 μm, and a variation in the distance between the two exciting ends is in the range of ±20 μm, the rays of light emitted from the two exciting ends of the LD chips 12 and 14 can be efficiently made enter the single optical fiber 30 (see FIG. 10) by rotating the wedge plate 86 in the angular range of ±5°.

By the way, the adjustment of the relative rotational angle between the wedge plates 86 and 88 will sometimes cause that the optic axis 86A of the wedge plate 86 becomes not orthogonal to the optic axis 88A of the wedge plate 88. When the ray of light is made enter the wedge plate 88 along the arrow 96 in FIG. 12 under the condition where the optic axes 86A and 88A are not orthogonal to each other, irradiation spots are generated on the X-Y plane 110 at not only the points of intersection 112 and 114 but also other two points. There is a possibility that the generation of the irradiation spots at such other two points will reduce the optical coupling efficiency in embodying the present invention.

However, if the angle of rotation of the wedge plate is very small (within ±5°) as mentioned above, a reduction in the optical coupling efficiency can be ignored because an optical power loss in this case is proportional to a square of cosine of the angle of rotation of the wedge plate. For example, when the angle of rotation is 5°, the optical power loss becomes about 0.03 dB.

Figure 13:
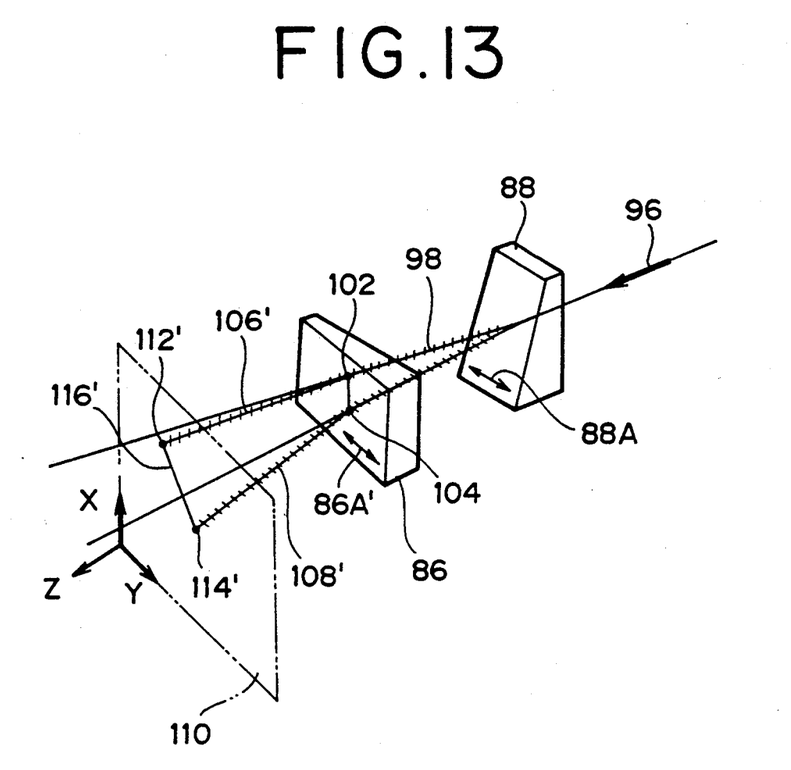
FIG. 13 is a view similar to FIG. 12, illustrating a modification of the fourth preferred embodiment shown in FIG. 10.

FIG. 13 is a view similar to FIG. 12, illustrating a modification of the fourth preferred embodiment shown in FIG. 10. This modification is identical with the construction shown in FIG. 12 in the point that the wedge directions of the wedge plates 86 and 88 in this modification are orthogonal to each other, but is different from the construction shown in FIG. 12 in the point that the optic axis 86A of the wedge plate 86 is parallel to the optic axis 88A of the wedge plate 88 in this modification. That is, the wedge plates 86 and 88 in this modification are formed from two birefringent crystal plates differing to each other in the relation between a cut face of a birefringent crystal and an optic axis. In this case, since the ray of light passing through the point of intersection 102 becomes an ordinary ray in the wedge plate 86, and the ray of light passing through the point of intersection 104 becomes an extraordinary ray in the wedge plate 86, an angle of refraction of the former light refracted by the wedge plate 86 becomes smaller than that of the latter light refracted by the wedge plate 86. Accordingly, a direction of inclination of a segment 116' with respect to the Y-axis becomes reverse to that of the segment 116 shown in FIG. 12, in which the segment 116' is formed to connect a point of intersection 112' between a principal axis 106' (corresponding to the principal axis 106 shown in FIG. 12) and the X-Y plane 110 and a point of intersection 114' between a principal axis 108' (corresponding to the principal axis 108 shown in FIG. 12) and the X-Y plane 110. Also in this modification, at least one of the wedge plates 86 and 88 is rotationally adjusted to thereby cope with a variation in relative positional relation between two LD chips.

Figure 14:
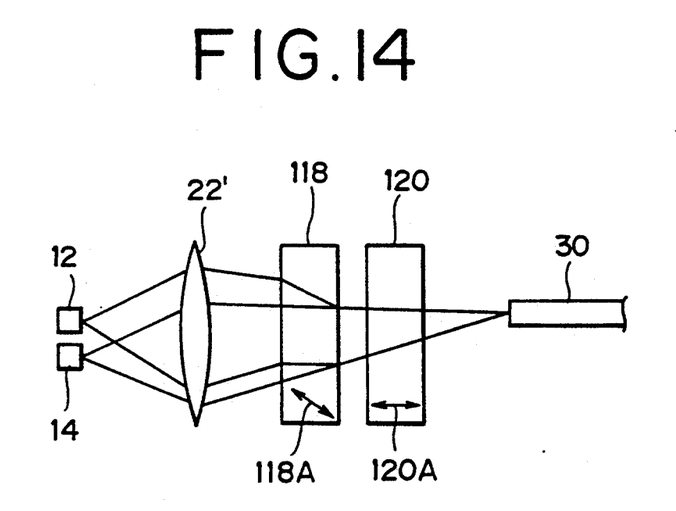
FIG. 14 is a schematic side view of an essential part of a light source module according to a fifth preferred embodiment of the present invention.

FIG. 14 shows an essential part of a light source module according to a fifth preferred embodiment of the present invention. LD chips 12 and 14, a lens 22' and an optical fiber 30 are arranged in this order. Further, two flat plates 118 and 120 formed from a birefringent crystal are provided between the lens 22' and the optical fiber 30. As similar to the previous preferred embodiments, the birefringent crystal is a uniaxial crystal such as rutile. An optic axis 118A of the flat plate 118 and an optic axis 120A of the flat plate 120 are perpendicular to each other in a three-dimensional space. Also in this preferred embodiment, at least one of the two flat plates 118 and 120 is rotationally adjusted to thereby cope with a variation in relative positional relation between the LD chips 12 and 14. In the principle previously described with reference to FIG. 12 or 13, the ray of light incident on the wedge plate 88 along a single optical path is angularly divided into two optical paths. To the contrary, in the fifth preferred embodiment shown in FIG. 14, assuming that a ray of light is incident on the flat plate 120 along a single optical path, this ray of light is divided into two optical paths parallel to each other. Accordingly, in the case of using a flat plate, it is preferable to use a single lens as in FIG. 14 rather than use two lenses to form a collimate beam system as in FIG. 10. In the fifth preferred embodiment, a distance between the LD chips 12 and 14 and the lens 22' is set to be larger than a focal length of the lens 22'.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A light source module having a first light source, a second light source and an optical fiber optically coupled with said first and second light sources, said light source module comprising:
   a first assembly comprising said first and second light sources arranged so that a plane of polarization of light emitted from said first light source is perpendicular to a plane of polarization of light emitted from said second light source;
   a first lens having a principal axis positioned between a first principal axis of said light emitted from said first light source and a second principal axis of said light emitted from said second light source;
   a birefringent element for receiving said light emitted from said first and second light sources and passed through said first lens and for outputting light on a single optical path;
   a second assembly comprising said optical fiber arranged so that said light output from said birefringent element enters an end of said optical fiber; and
   holding means for holding said first lens and said birefringent element to said first assembly and said second assembly so as to maintain predetermined positional relation.

2. A light source module according to claim 1, further comprising a second lens provided between said birefringent element and said end of said optical fiber;
   said first and second light sources being positioned at or in the vicinity of a focal point of said first lens;
   said end of said optical fiber being positioned at or in the vicinity of a focal point of said second lens.

3. A light source module according to claim 1, wherein a distance between each of said first and second light sources and said first lens is larger than a focal length of said first lens, and said light output from said birefringent element enters directly to said end of said optical fiber.

4. A light source module according to claim 1, wherein said first lens comprises a graded index rod lens.

5. A light source module according to claim 1, wherein said first and second light sources comprise first and second laser diode chips.

6. A light source module according to claim 5, wherein said first and second laser diode chips are of two different types;
   one of said two different types being a type such that a plane of polarization of light emitted from said first laser diode chip is perpendicular to an active layer of said first laser diode chip;

another of said two different types being a type such that a plane of polarization of light emitted from said second laser diode chip is parallel to an active layer of said second laser diode chip;

said first and second laser diode chips being arranged so that said active layers of said first and second laser diode chips are parallel to each other.

7. A light source module according to claim 5, wherein said first and second laser diode chips are of the same type as one of two different types;

one of said two different types being a type such that planes of polarization of light emitted from said laser diode chips are perpendicular to active layers of said laser diode chips;

another of said two different types being a type such that planes of polarization of light emitted from said laser diode chips are parallel to active layers of said laser diode chips;

said first and second laser diode chips being arranged so that said active layers of said first and second laser diode chips are perpendicular to each other.

8. A light source module according to claim 5, wherein said first and second laser diode chips are selectively driven, and a driving current modulated by a transmission data is supplied to a selected one of said first and second laser diode chips.

9. A light source module according to claim 5, wherein said first and second laser diode chips are simultaneously driven so as to emit light having same wavelength, and a constant or controlled driving direct current is supplied to said first and second laser diode chips.

10. A light source module according to claim 1, wherein said birefringent element comprises a wedge plate formed from a birefringent crystal;

said wedge plate having an optic axis substantially perpendicular to said first and second principal axes;

said light emitted from said first and second light sources entering said wedge plate as an ordinary ray and an extraordinary ray, respectively.

11. A light source module according to claim 1, wherein said birefringent element comprises a first wedge plate and a second wedge plate each formed from a birefringent crystal;

said first and second wedge plates being arranged so that said light emitted from said first and second light sources pass through said first and second wedge plates in this order;

said first wedge plate having a wedge direction substantially perpendicular to a wedge direction of said second wedge plate;

said holding means including means for rotatably holding at least one of said first and second wedge plates.

12. A light source module according to claim 11, wherein said first and second wedge plates have optic axes substantially perpendicular to each other.

13. A light source module according to claim 11, wherein said first and second wedge plates have optic axes substantially parallel to each other.

14. A light source module according to claim 1, wherein said birefringent element comprises a first flat plate and a second flat plate each formed from a birefringent crystal;

said first and second flat plates having optic axes substantially perpendicular to each other;

said first and second flat plates being arranged so that said light emitted from said first and second light sources pass through said first and second flat plates in this order;

said holding means including means for rotatably holding at least one of said first and second flat plates.

15. A light source module according to claim 14, wherein a distance between each of said first and second light sources and said first lens is larger than a focal length of said first lens, and light output from said second flat plate enters directly to said end of said optical fiber.

16. A light source module according to claim 1, wherein said first and second principal axes are substantially parallel to each other, and said principal axis of said first lens is substantially parallel to said first and second principal axes.

* * * * *